(12) United States Patent
Peng et al.

(10) Patent No.: US 12,369,459 B2
(45) Date of Patent: Jul. 22, 2025

(54) ORGANIC LIGHT-EMITTING DISPLAY PANEL AND MANUFACTURING METHOD THEREFOR, AND DISPLAY DEVICE

(71) Applicants: Ordos Yuansheng Optoelectronics Co., Ltd., Ordos (CN); BOE Technology Group Co., Ltd., Beijing (CN)

(72) Inventors: Liman Peng, Beijing (CN); Liangliang Liu, Beijing (CN); Nini Bai, Beijing (CN); Liang Tang, Beijing (CN); Qiang Guo, Beijing (CN); Yan Wu, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 499 days.

(21) Appl. No.: 17/922,482
(22) PCT Filed: Jun. 8, 2021
(86) PCT No.: PCT/CN2021/098960
  § 371 (c)(1),
  (2) Date: Oct. 31, 2022
(87) PCT Pub. No.: WO2022/017029
  PCT Pub. Date: Jan. 27, 2022

(65) Prior Publication Data
  US 2023/0180529 A1    Jun. 8, 2023

(30) Foreign Application Priority Data
  Jul. 21, 2020 (CN) .......................... 202010702752.8

(51) Int. Cl.
  *H10K 59/122* (2023.01)
  *H10K 59/12* (2023.01)
  (Continued)

(52) U.S. Cl.
  CPC ....... *H10K 59/122* (2023.02); *H10K 59/1201* (2023.02); *H10K 59/8051* (2023.02); *H10K 71/00* (2023.02); *H10K 2102/351* (2023.02)

(58) Field of Classification Search
  CPC ............. H10K 50/81; H10K 2102/351; H10K 59/122; H10K 59/173; H10K 59/8051; H10K 71/00; H10K 71/60; H10K 59/1201
  See application file for complete search history.

(56) References Cited

U.S. PATENT DOCUMENTS

| | | | |
|---|---|---|---|
| 8,350,464 B1 * | 1/2013 | Jeong | H10K 50/852 313/503 |
| 2007/0111369 A1 | 5/2007 | Chun et al. | |

(Continued)

FOREIGN PATENT DOCUMENTS

| | | |
|---|---|---|
| CN | 107689390 A | 2/2018 |
| CN | 110993646 A | 4/2020 |

(Continued)

OTHER PUBLICATIONS

PCT/CN2021/098960 international search report.
CN 202010702752.8 first office action.
CN 202010702752.8 second office action.

*Primary Examiner* — Jaehwan Oh
(74) *Attorney, Agent, or Firm* — IPro, PLLC (57) ABSTRACT

A method for fabricating an organic light emitting display panel includes: forming an anode-material layer on a base plate, forming a mask on one side of the anode-material layer away from the base plate, and performing patterning treatment to the anode-material layer by using the mask, to form multiple anodes; and forming a pixel definition layer covering the mask and the base plate, and performing patterning treatment to the pixel definition layer and the mask at the same time, to form a multiple pixel defining components, wherein the pixel defining components cover parts of the base plate located between two neighboring anodes, and cover part of surfaces of the anodes; and a material forming the mask and a material forming the pixel (Continued)

definition layer are the same, each of the pixel defining components includes a first part formed by the mask, and a second part formed by the pixel definition layer.

10 Claims, 3 Drawing Sheets

(51) Int. Cl.
*H10K 59/80* (2023.01)
*H10K 71/00* (2023.01)
*H10K 102/00* (2023.01)

(56) References Cited

U.S. PATENT DOCUMENTS

| | | | |
|---|---|---|---|
| 2009/0179560 A1* | 7/2009 | Chun | H10K 59/80518 |
| | | | 313/504 |
| 2010/0045173 A1* | 2/2010 | Kwon | H10K 59/12 |
| | | | 313/504 |
| 2019/0115402 A1 | 4/2019 | Wang et al. | |
| 2020/0379604 A1 | 12/2020 | Xia et al. | |
| 2021/0359044 A1 | 11/2021 | Fan et al. | |

FOREIGN PATENT DOCUMENTS

| | | |
|---|---|---|
| CN | 111799398 A | 10/2020 |
| IN | 110085651 A | 8/2019 |

* cited by examiner

ORGANIC LIGHT-EMITTING DISPLAY PANEL AND MANUFACTURING METHOD THEREFOR, AND DISPLAY DEVICE

PRIORITY DATA

The present application claims the priority and the benefit of the patent application filed before the China National Intellectual Property Administration on Jul. 21, 2020 with the application number of 202010702752.8, which is incorporated herein in its entirety by reference.

TECHNICAL FIELD

The present disclosure relates to the technical field of displaying and more particularly, to an organic light emitting display panel and a fabricating method thereof, and a displaying device.

BACKGROUND

Organic light emitting display panels (OLED) are display panels fabricated by using organic light emitting diodes, and have the advantages such as self-illumination, a high contrast, a low thickness, a wide visual angle, a high reaction speed and applicability to flexible panels. An organic light emitting diode includes an anode, an organic luminescent layer and a cathode that are arranged sequentially in stack, and when the organic light emitting diode is electrified, the organic light emitting diode can emit light.

However, the conventional organic light emitting display panels, fabricating methods thereof and displaying devices still require improvement.

SUMMARY

The present disclosure is made on the basis of the finding and knowledge with respect to the following facts and problems by the inventor:

the inventor has found that the conventional organic light emitting display panels have problems of a poor displaying quality and a long production cycle. That is mainly caused by the defect of the conventional method of fabricating organic light emitting display panels. Particularly, currently, in the process of fabricating organic light emitting display panels, after the anode-material layer is etched, it is required to strip the photoresist mask on the anode-material layer, to obtain the anodes. However, in the process of stripping the photoresist mask, the anodes are exposed, and undergo high-pressure-water rinsing, which easily causes missing of the anode edges or blowing-up and warping of the anode edges. Furthermore, after the photoresist mask has been stripped, before the pixel definition layer is provided, high-pressure-water rinsing is performed again, and at this point the edges of the anodes more easily have warpage or missing. Because the thickness of the organic luminescent layers is low, after the anode edges have warped, the warped parts very easily penetrate the organic luminescent layers, directly contact the cathodes and have short circuiting, which results in dark-spot imperfects and missing of the anode edges, and thus causes an insufficient displaying luminance of the pixels, thereby affecting the quality of the displaying of the organic light emitting display panel. Furthermore, such a process has many process steps and a long production cycle, which affects the production capacity.

The present disclosure aims at alleviating or solving at least one of the above-mentioned problems at least to a certain extent.

In an aspect of the present disclosure, the present disclosure provides a method for fabricating an organic light emitting display panel. The method includes:

forming an anode-material layer on a base plate, forming a mask on one side of the anode-material layer that is away from the base plate, and performing patterning treatment to the anode-material layer by using the mask, to form a plurality of anodes; and forming a pixel definition layer covering the mask and the base plate, wherein the pixel definition layer is provided with slots between the plurality of anodes, and performing patterning treatment to the pixel definition layer and the mask at the same time, to form a plurality of pixel defining components, wherein the pixel defining components cover parts of the base plate that are located between two neighboring anodes, and cover part of surfaces of the anodes; and a material forming the mask and a material forming the pixel definition layer are the same, each of the pixel defining components includes a first part formed by the mask, and a second part formed by the pixel definition layer, and the slots are located in the second parts. Accordingly, the method may omit the process step of stripping the mask and omit the process step of high-pressure-water rinsing in the process of stripping the mask, alleviate the defect of missing or warpage of the anode edges, and improve the quality of the displaying of the organic light emitting display panel, and can shorten the production cycle, increase the production capacity, and reduce the cost.

According to an embodiment of the present disclosure, the step of forming the anodes includes:

forming a mask-material layer on the side of the anode-material layer that is away from the base plate, and performing exposure and development to the mask-material layer to form the mask; and etching the anode-material layer by using the mask, to form the anodes. Accordingly, the mask can be fabricated by using the existing production lines and equipment, without adding new production lines and equipment, and the method may omit the process step of stripping the mask and omit the process step of high-pressure-water rinsing in the process of stripping the mask, to shorten the production cycle, and reduce the cost.

According to an embodiment of the present disclosure, the step of forming the pixel defining components includes:

performing exposure and development to the pixel definition layer and the mask, to form the pixel defining components. Accordingly, the pixel defining components may be fabricated by using existing production lines and equipment for fabricating pixel defining components, which has a simple process and may realize the synchronous patterning of the mask and the pixel definition layer.

According to an embodiment of the present disclosure, a thickness of the mask is 5000 Å-7000 Å. Accordingly, the mask has a suitable thickness, and in the subsequent high-pressure-water rinsing before forming the pixel definition layer, the mask having the above-described thickness may protect the anodes well, to alleviate missing or warpage of the anode edges in the high-pressure-water rinsing. Because the remaining parts of the mask and the pixel definition layer after the patterning together form the pixel defining components, the mask having the above-described thickness does not significantly increase the thickness of the entire organic light emitting display panel.

According to an embodiment of the present disclosure, the base plate includes a substrate and a pixel-circuit layer provided on the substrate, and the anode-material layer is provided on one side of the pixel-circuit layer that is away from the substrate. Accordingly, the pixel-circuit layer may be used to control the subsequently formed organic light emitting diode to emit light and perform luminance compensation to the organic light emitting diode.

In another aspect of the present disclosure, the present disclosure provides an organic light emitting display panel. The organic light emitting display panel includes:

a base plate;

a plurality of anodes, wherein the anodes are arranged on the base plate; and pixel defining components, wherein each of the pixel defining components includes a first part and a second part, the first part covers part of surfaces of the anodes, the second part covers the first part and a part of the base plate that is located between two neighboring anodes, and a material forming the first part and a material forming the second part are the same. Accordingly, the process of fabricating the organic light emitting display panel may omit the process step of stripping the mask and omit the process step of high-pressure-water rinsing in the process of stripping the mask, to shorten the production cycle, increase the production capacity, and reduce the cost, and flat and complete anodes are obtained, to ameliorate imperfects of the organic light emitting display panel such as dark spots and an insufficient luminance, and improve the quality of the displaying of the organic light emitting display panel.

According to an embodiment of the present disclosure, a thickness of the first part is 5000 Å-7000 Å. In other words, in the process of fabricating the organic light emitting display panel, the thickness of the mask is 5000 Å-7000 Å. Accordingly, in the high-pressure-water rinsing before forming the pixel definition layer, the mask having the above-described thickness can protect the anodes well, alleviate missing or warpage of the anode edges, and improve the quality of the displaying of the organic light emitting display panel.

According to an embodiment of the present disclosure, parts of the second parts that cover the first parts and parts of the second parts that cover the base plate form slots, and a depth of the slots is greater than 5000 Å. Because, in the process of fabricating the organic light emitting display panel, the mask is not stripped, and the mask and the pixel definition layer, after the subsequent synchronous patterning, together form the pixel defining components, the pixel defining components are formed by two parts, wherein the first part has a higher thickness, whereby the second part is formed as a slot.

According to an embodiment of the present disclosure, the base plate includes a substrate and a pixel-circuit layer provided on the substrate, and the anodes are provided on one side of the pixel-circuit layer that is away from the substrate. Accordingly, the pixel-circuit layer may be used to control the organic light emitting diode to emit light and perform luminance compensation to the organic light emitting diode.

In another aspect of the present disclosure, the present disclosure provides a displaying device. The displaying device includes the organic light emitting display panel stated above. Accordingly, the displaying device has all of the features and the advantages of the organic light emitting display panel stated above, which is not discussed herein further. In conclusion, the displaying device has advantages such as a high displaying quality, a short production cycle, a high production capacity and a low cost.

BRIEF DESCRIPTION OF THE DRAWINGS

The above and/or additional aspects and advantages of the present disclosure will become apparent and readily understandable from the following description on the embodiments with respect to the drawings. in the drawings.

REFERENCE NUMBERS

100: base plate; 200: anodes; 210: anode-material layer; 300: photoresist masks; 400: pixel defining components; 410: pixel definition layer; 500: mask; 10: first part; 20: second part; and 30: slot.

DETAILED DESCRIPTION

The embodiments of the present disclosure will be described in detail below, and the examples of the embodiments are illustrated in the drawings, wherein the same or similar reference numbers throughout the drawings indicate the same or similar elements or elements having the same or similar functions. The embodiments described below with reference to the drawings are exemplary, are merely intended to interpret the present disclosure, and should not be construed as a limitation on the present disclosure.

Figure 2:
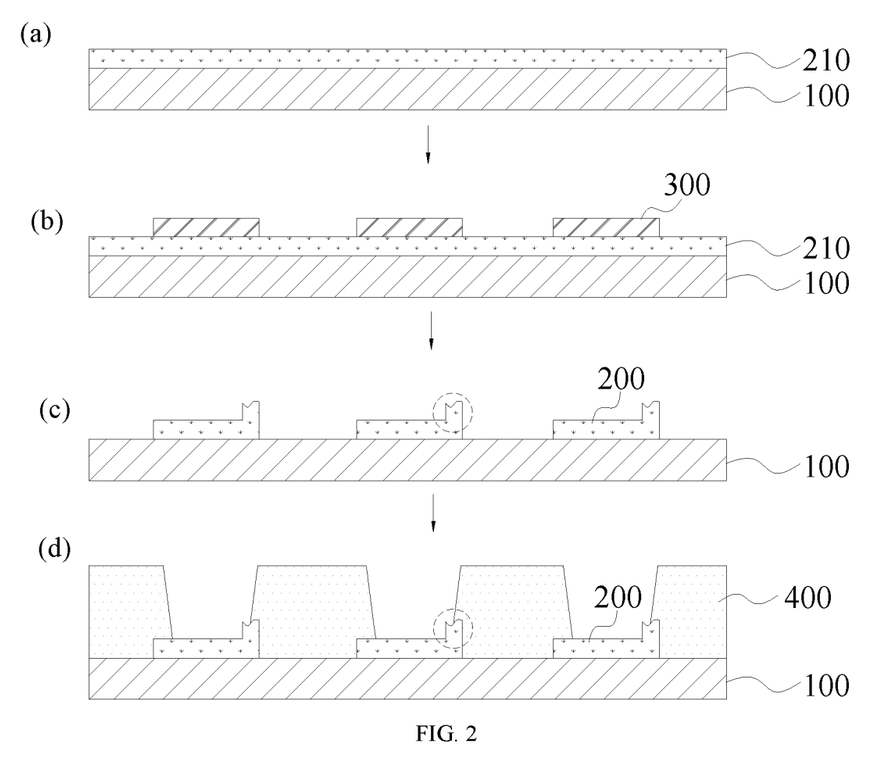
FIG. 2 shows a schematic flow chart of a conventional method for fabricating an organic light emitting display panel.

The present disclosure is made on the basis of the following finding of the inventor:

The conventional method for fabricating an organic light emitting display panel is as follows. Referring to FIG. 2, firstly, an anode-material layer 210 is formed on the base plate 100 (referring to (a) in FIG. 2). Subsequently, photoresist masks 300 are formed on the side of the anode-material layer 210 that is away from the base plate 100, and the plurality of photoresist masks 300 are arranged at interval (referring to (b) in FIG. 2). Subsequently, the anode-material layer 210 is etched by using the photoresist masks 300, to remove the parts of the anode-material layer 210 that are not covered by the photoresist masks 300, the photoresist masks 300 are stripped, and high-pressure-water rinsing is performed, to obtain anodes 200 (referring to (c) in FIG. 2). Subsequently, the high-pressure-water rinsing is continued, and subsequently pixel defining components 400 are formed on the base plate 100, wherein the pixel defining components 400 are located between two neighboring anodes 200, and cover part of the anodes 200 (referring to (d) in FIG. 2). Subsequently, organic luminescent layers and cathodes (not shown in the drawings) are sequentially formed on the sides of the anodes 200 that are away from the base plate 100.

In the process of stripping the photoresist masks 300, the anodes 200 are continuously exposed, and after the exposed anodes 200 undergo the high-pressure-water rinsing, the edge easily have missing or warpage (referring to (c) in FIG. 2). Before the pixel defining components 400 are provided, the high-pressure-water rinsing is continued, which further causes missing or warpage of the edges of the anodes 200. Subsequently, after the organic luminescent layers and the cathodes are provided on the anodes, the warped parts of the anode edges penetrate the organic luminescent layers and have short circuiting with the cathodes, which results in dark-spot imperfects and missing of the anode edges, causes an insufficient displaying luminance of the pixels, and affects the quality of the displaying of the organic light emitting display panel. Furthermore, such a process requires the stripping of the photoresist masks, and requires multiple times of the high-pressure-water rinsing, which has many process steps and a long period, thereby affecting the production capacity.

In view of the above, in an aspect of the present disclosure, the present disclosure provides a method for fabricating an organic light emitting display panel.

According to the embodiments of the present disclosure, the present disclosure optimizes the process of fabricating organic light emitting display panels. Particularly, the anodes are fabricated by providing the mask of the same material as that of the pixel definition layer. Because the material of the mask and the material of the pixel definition layer are the same, after the anodes are formed, the mask on the anodes may be reserved, and, subsequently, after the pixel definition layer is formed, the mask and the pixel definition layer undergo patterning treatment at the same time, to obtain the pixel defining components. In other words, the remaining parts of the mask and the pixel definition layer after the patterning together form the pixel defining components, and the other part of the mask than the parts used to form the pixel defining components may be removed by patterning at the same time with the pixel definition layer. Accordingly, the process of fabricating the organic light emitting display panel according to the present disclosure does not require stripping the mask, which can omit the process step of stripping the mask and omit the process step of high-pressure-water rinsing in the process of stripping the mask, thereby alleviating missing or warpage of the anode edges, ameliorating imperfects of the organic light emitting display panel such as dark spots and an insufficient luminance, and improving the quality of the displaying of the organic light emitting display panel, and can reduce the process steps of the fabrication, shorten the production cycle, and significantly increase the production capacity. Furthermore, because the mask is not stripped, subsequently, before the pixel definition layer is formed, even if the high-pressure-water rinsing is performed, the mask on the anodes can protect the anodes, to further alleviate missing or warpage of the anode edges, and further improve the quality of the displaying of the organic light emitting display panel.

Figure 1:
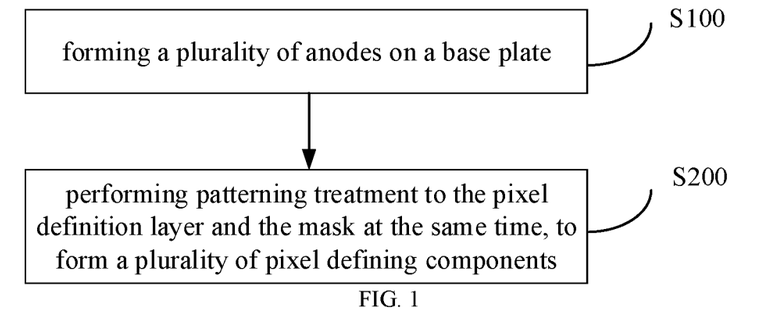
FIG. 1 shows a schematic flow chart of a method for fabricating an organic light emitting display panel according to an embodiment of the present disclosure.

The steps of the method will be described in detail below according to the particular embodiments of the present disclosure:

According to an embodiment of the present disclosure, referring to FIG. 1, the method includes:

S100: forming a plurality of anodes on a base plate.

Figure 3:
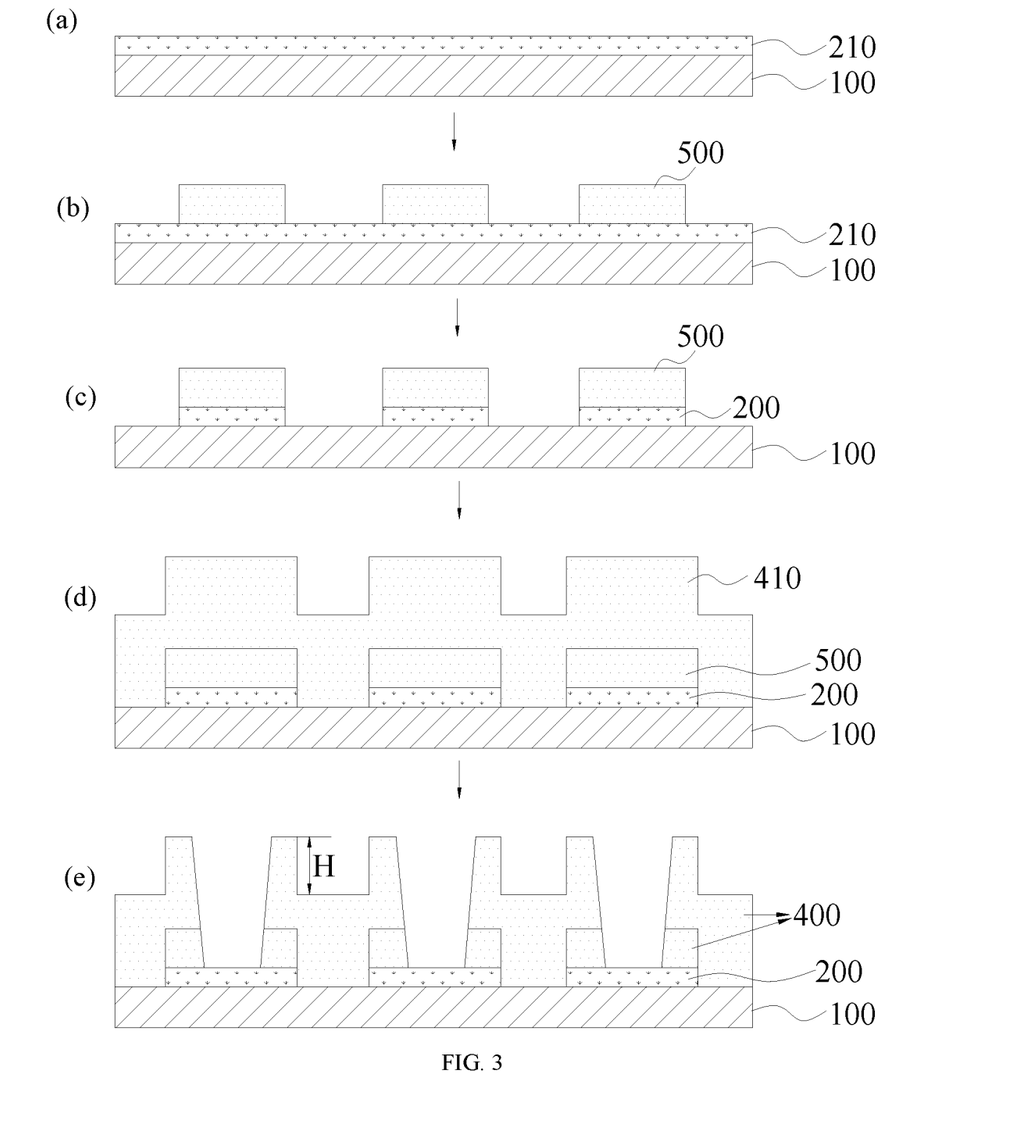
FIG. 3 shows a schematic flow chart of a method for fabricating an organic light emitting display panel according to an embodiment of the present disclosure.

According to an embodiment of the present disclosure, in this step, a plurality of anodes are formed on a base plate. Particularly, firstly, an anode-material layer 210 is formed on the base plate 100 (referring to (a) in FIG. 3). Subsequently, a mask 500 is formed on the side of the anode-material layer 210 that is away from the base plate 100 (referring to (b) in FIG. 3). Subsequently, patterning treatment is performed to the anode-material layer 210 by using a mask 500, to form a plurality of anodes 200 (referring to (c) in FIG. 3). The material of the mask 500 is the same as the material of the subsequently formed pixel definition layer. Accordingly, in this step, the mask on the anodes may be reserved, and the mask on the anodes may be patterned at the same time with the pixel definition layer after the pixel definition layer is formed subsequently, to form the pixel defining components; in other words, the remaining parts of the mask and the pixel definition layer after the patterning together form the pixel defining components. Therefore, the method may omit the process step of stripping the mask and omit the process step of high-pressure-water rinsing in the process of stripping the mask, alleviate missing or warpage of the anode edges, and improve the quality of the displaying of the organic light emitting display panel, and may shorten the production cycle, and increase the production capacity.

According to an embodiment of the present disclosure, in the process of the formation of the anodes, firstly, a mask-material layer is formed on the side of the anode-material layer that is away from the base plate, subsequently exposure and development is performed to the mask-material layer, to form a plurality of masks, and, finally, the anode-material layer is etched by using the masks, to form the plurality of anodes. A person skilled in the art can understand that, when the anode-material layer is etched, the parts of the anode-material layer that are not covered by the masks are etched off, and the parts of the anode-material layer that are covered by the masks are the obtained anodes. Accordingly, the mask may be fabricated by using the existing production lines and equipment, without adding new production lines and equipment, and the method may omit the process step of stripping the mask and omit the process step of high-pressure-water rinsing in the process of stripping the mask, to significantly reduce the cost, and shorten the production cycle. The method of forming the mask-material layer is not particularly limited. For example, a mask-material layer may be spread-coated on the side of the anode-material layer that is away from the base plate.

According to an embodiment of the present disclosure, the thickness of the mask may be 5000 Å-7000 Å, for example, 5000 Å, 5500 Å, 6000 Å, 6500 Å and 7000 Å. Accordingly, the mask has a suitable thickness, and in the subsequent high-pressure-water rinsing before forming the pixel definition layer, the mask having the above-described thickness may protect the anodes well, to alleviate missing or warpage of the anode edges in the high-pressure-water rinsing. Because the remaining parts of the mask and the pixel definition layer after the patterning together form the pixel defining components, the mask having the above-described thickness does not significantly increase the thickness of the entire organic light emitting display panel.

The particular material forming the mask is not particularly limited, and may be configured by a person skilled in the art according to materials commonly used for the pixel definition layer.

According to an embodiment of the present disclosure, the base plate includes a substrate and a pixel-circuit layer provided on the substrate, and the anode-material layer is provided on the side of the pixel-circuit layer that is away from the substrate. The pixel-circuit layer is used to control the organic light emitting diode to emit light and perform luminance compensation to the organic light emitting diode. The particular structure and forming method of the pixel-circuit layer are not particularly limited, and may be configured by a person skilled in the art according to commonly used structures of the pixel circuits in organic light emitting display panels.

S200: performing patterning treatment to the pixel definition layer and the mask at the same time, to form a plurality of pixel defining components.

According to an embodiment of the present disclosure, in this step, the pixel definition layer and the mask undergo patterning treatment at the same time, to form a plurality of pixel defining components. Particularly, firstly, a pixel definition layer 410 covering the mask 500 and the base plate 100 are formed (referring to (d) in FIG. 3). Because the anodes are covered by the mask 500, the pixel definition layer 410 form slots between the plurality of anodes 200. Subsequently, the pixel definition layer 410 and the mask 500 undergo patterning treatment at the same time, to form a plurality of pixel defining components 400. The pixel defining components 400 cover the parts of the base plate 100 that are located between two neighboring anodes 200, and cover part of the surfaces of the anodes 200 (Referring to (e) in FIG. 3). Accordingly, the mask formed in the S100 can be patterned at the same time with the pixel definition layer in this step, the remaining parts of the mask and the pixel definition layer after the patterning together form the pixel defining components, each of the pixel defining components includes a first part formed by the mask, and a second part formed by the pixel definition layer, and the slots described above are located in the second parts.

According to an embodiment of the present disclosure, after exposure and development has been performed to the mask and the pixel definition layer, the remaining parts of the mask and the pixel definition layer are solidified, to form the pixel defining components. The pixel defining components may prevent cross-color between two neighboring organic light emitting diodes.

According to an embodiment of the present disclosure, before the pixel definition layer is formed, the high-pressure-water rinsing is continued. In this case, because the anodes are covered by the mask, that can effectively alleviate defects of the anode edges such as missing and warpage in the high-pressure-water rinsing, to obtain flat and complete anodes, to ameliorate imperfects of the organic light emitting display panel such as dark spots and an insufficient luminance, and improve the quality of the displaying of the organic light emitting display panel. It should be noted that the particular hydraulic pressure in the high-pressure-water rinsing may be the hydraulic pressure in the high-pressure-water rinsing for the fabrication of conventional organic light emitting display panels.

According to an embodiment of the present disclosure, the patterning treatment to the mask and the pixel definition layer may be exposure and development to the mask and the pixel definition layer, to obtain the pixel defining components. Accordingly, the pixel defining components can be fabricated by using existing production lines and equipment for fabricating pixel defining components, which has a simple process and can realize the synchronous patterning of the mask and the pixel definition layer.

According to an embodiment of the present disclosure, the mask and the pixel definition layer after the patterning together form the pixel defining components. Because the thickness of the parts of the pixel definition layer that cover the mask and the thickness of the parts that cover the base plate are equal, and the thickness of the mask is higher, the parts of the pixel definition layer after the patterning that cover the mask and the parts that cover the base plate form deep slots(referring to (e) in FIG. 3), and the depth of the slots (for example, H shown in (e) in FIG. 3) is greater than 5000 Å. However, the conventional pixel defining components directly cover the anodes, and the anodes have a low thickness, which is generally hundreds of Å. Therefore, the slots formed by the parts of the pixel defining components that cover the anodes and the parts that cover the base plate are not obvious; in other words, the slots have a lower depth.

According to an embodiment of the present disclosure, the method further includes: Sequentially forming organic luminescent layers and cathodes on the sides of the anodes that are away from the base plate. Accordingly, the organic light emitting diodes are formed. The particular process of fabricating the organic luminescent layers and the cathodes is not particularly limited, and may be configured by a person skilled in the art according to conventional processes of organic luminescent layers and cathodes.

According to an embodiment of the present disclosure, the method further includes: forming a supporting component on the sides of the pixel defining components that are away from the base plate. The supporting component can support other base plates that are subsequently provided, to prevent the other base plates from being squeezed, which affects the performance of the organic light emitting diodes. The particular process of fabricating the supporting component is not particularly limited, and may be configured by a person skilled in the art according to conventional processes of supporting components. For example, firstly, a supporting layer is formed on the sides of the pixel defining components that are away from the base plate, subsequently the supporting layer undergoes patterning treatment, and the remaining parts after the patterning are solidified, to obtain a supporting component.

In another aspect of the present disclosure, the present disclosure provides an organic light emitting display panel. According to an embodiment of the present disclosure, the organic light emitting display panel may be an organic light emitting display panel that is fabricated by using the above-described method. Accordingly, the organic light emitting display panel has the same features and advantages as those of the organic light emitting display panel that is fabricated by using the above-described method, which is not discussed herein further.

Figure 4:
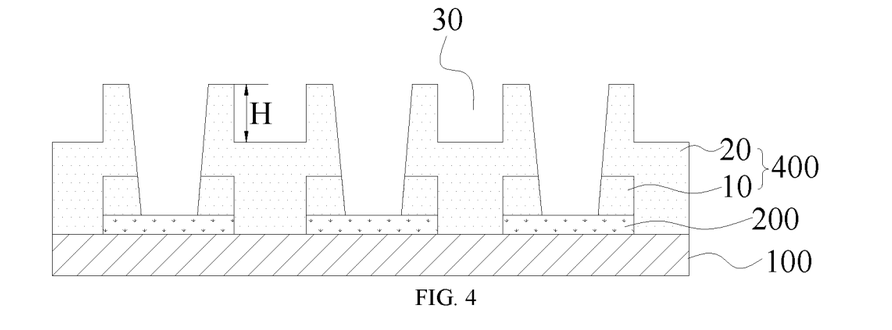
FIG. 4 shows a schematic structural diagram of an organic light emitting display panel according to an embodiment of the present disclosure.

According to an embodiment of the present disclosure, referring to FIG. 4, the organic light emitting display panel includes: a base plate 100, a plurality of anodes 200 and a plurality of pixel defining components 400, the anodes 200 are provided on the base plate 100, each of the pixel defining components 400 includes a first part 10 and a second part 20, the first part 10 covers part of the surface of one of the anodes 200, the second part 20 covers the first part 10 and a part of the base plate 100 that is located between two neighboring anodes 200, and the material forming the first part 10 and the material forming the second part 20 are the same. Accordingly, the process of fabricating the organic light emitting display panel may omit the process step of stripping the mask and omit the process step of high-pressure-water rinsing in the process of stripping the mask, to shorten the production cycle, increase the production capacity, and reduce the cost, and flat and complete anodes are obtained, to ameliorate imperfects of the organic light emitting display panel such as dark spots and an insufficient luminance, and improve the quality of the displaying of the organic light emitting display panel.

It should be noted that, as stated above, in the process of fabricating the organic light emitting display panel, the mask is formed on the side of the anode-material layer that is away from the base plate, and the anode-material layer is etched by using the mask, to form the plurality of anodes, and reserve the mask on the anodes. Subsequently, the pixel definition layer covering the mask and the base plate is formed. Finally, the mask and the pixel definition layer undergo patterning treatment at the same time. The mask forms the first parts after the patterning treatment, the pixel definition layer forms the second parts after the patterning treatment, and the first parts and the second parts form the pixel defining components; in other words, the remaining parts of the mask and the pixel definition layer after the patterning treatment together form the pixel defining components.

According to an embodiment of the present disclosure, the thickness of the first part 10 may be 5000 Å-7000 Å. In other words, in the process of fabricating the organic light emitting display panel, the thickness of the mask is 5000 Å-7000 Å. Accordingly, in the high-pressure-water rinsing before forming the pixel definition layer, the mask having the above-described thickness can protect the anodes well, alleviate missing or warpage of the anode edges, and improve the quality of the displaying of the organic light emitting display panel.

According to an embodiment of the present disclosure, because the thickness of the first part 10 is higher, the parts of the second parts 20 that cover the first parts 10 and the parts of the second parts 20 that cover the base plate 100 form slots 30, and the depth of the slots 30 (for example, H shown in FIG. 4) is greater than 5000 Å. Because, in the process of fabricating the organic light emitting display panel, the mask is not stripped, and the mask and the pixel definition layer, after the subsequent synchronous patterning, together form the pixel defining components, the pixel defining components are formed by two parts, wherein the first parts have a higher thickness, and the thicknesses of the parts of the second parts are equal, whereby the parts of the second parts that cover the first parts and the parts of the second parts that cover the base plate form slots.

According to an embodiment of the present disclosure, the base plate 100 includes a substrate and a pixel-circuit layer (not shown in the drawings) provided on the substrate, and the anodes 200 are provided on the side of the pixel-circuit layer that is away from the substrate. Accordingly, the pixel-circuit layer may be used to control the organic light emitting diode to emit light and perform luminance compensation to the organic light emitting diode. The particular structure of the pixel-circuit layer is not particularly limited, and may be configured by a person skilled in the art according to actual situations.

In another aspect of the present disclosure, the present disclosure provides a displaying device. According to an embodiment of the present disclosure, the displaying device includes the organic light emitting display panel described above. Accordingly, the displaying device has all of the features and the advantages of the organic light emitting display panel stated above, which is not discussed herein further. In conclusion, the displaying device has advantages such as a high displaying quality, a short production cycle, a high production capacity and a low cost.

In the description of the present disclosure, the terms that indicate orientation or position relations, such as "upper" and "lower", are based on the orientation or position relations shown in the drawings, and are merely for conveniently describing the present disclosure, rather than requiring that the present disclosure must be constructed and operated according to the specific orientation. Therefore, they should not be construed as a limitation on the present disclosure.

In the description of the present disclosure, the description referring to the terms "an embodiment", "another embodiment" and so on means that particular features, structures, materials or characteristics described with reference to the embodiment are included in at least one of the embodiments of the present disclosure. In the description, the illustrative expressions of the above terms do not necessarily relate to the same embodiment or example. Furthermore, the described particular features, structures, materials or characteristics may be combined in one or more embodiments or examples in a suitable form. Moreover, subject to avoiding contradiction, a person skilled in the art may combine different embodiments or examples described in the description and the features of the different embodiments or examples. In addition, it should be noted that, in the description, the terms "first" and "second" are merely for the purpose of describing, and should not be construed as indicating or implying the degrees of importance or implicitly indicating the quantity of the specified technical features.

Although the embodiments of the present disclosure have already been illustrated and described above, it can be understood that the above embodiments are illustrative, and should not be construed as a limitation on the present disclosure, and a person skilled in the art may make variations, modifications, substitutions and improvements to the above embodiments within the scope of the present disclosure.

The invention claimed is:

1. A method for fabricating an organic light emitting display panel, wherein the method comprises:
    forming an anode-material layer on a base plate, forming a mask on one side of the anode-material layer that is away from the base plate, and performing patterning treatment to the anode-material layer by using the mask, to form a plurality of anodes; and
    forming a pixel definition layer covering the mask and the base plate, wherein the pixel definition layer is provided with slots between the plurality of anodes, and performing patterning treatment to the pixel definition layer and the mask at the same time, to form a plurality of pixel defining components, wherein the pixel defining components cover parts of the base plate that are located between two neighboring anodes, and cover part of surfaces of the anodes; and
    a material forming the mask and a material forming the pixel definition layer are the same, each of the pixel defining components comprises a first part formed by the mask, and a second part formed by the pixel definition layer, and the slots are located in the second parts.

2. The method according to claim 1, wherein forming the anodes comprises:
    forming a mask-material layer on the side of the anode-material layer that is away from the base plate, and performing exposure and development to the mask-material layer to form the mask; and
    etching the anode-material layer by using the mask, to form the anodes.

3. The method according to claim 1, wherein forming the pixel defining components comprises:
    performing exposure and development to the pixel definition layer and the mask, to form the pixel defining components.

4. The method according to claim 1, wherein a thickness of the mask is 5000 Å-7000 Å.

5. The method according to claim 1, wherein the base plate comprises a substrate and a pixel-circuit layer provided on the substrate, and the anode-material layer is provided on one side of the pixel-circuit layer that is away from the substrate.

6. An organic light emitting display panel, wherein the organic light emitting display panel comprises:
- a base plate;
- a plurality of anodes, wherein the anodes are arranged on the base plate; and
- pixel defining components, wherein each of the pixel defining components comprises a first part and a second part, the first part covers part of surfaces of the anodes, the second part covers the first part and a part of the base plate that is located between two neighboring anodes, and a material forming the first part and a material forming the second part are the same.

7. The organic light emitting display panel according to claim 6, wherein a thickness of the first part is 5000 Å-7000 Å.

8. The organic light emitting display panel according to claim 7, wherein parts of the second parts that cover the first parts and parts of the second parts that cover the base plate form slots, and a depth of the slots is greater than 5000 Å.

9. The organic light emitting display panel according to claim 6, wherein the base plate comprises a substrate and a pixel-circuit layer provided on the substrate, and the anodes are provided on one side of the pixel-circuit layer that is away from the substrate.

10. A displaying device, wherein the displaying device comprises the organic light emitting display panel according to claim 6.

* * * * *